(12) United States Patent
Lin et al.

(10) Patent No.: US 8,541,264 B2
(45) Date of Patent: *Sep. 24, 2013

(54) METHOD FOR FORMING SEMICONDUCTOR STRUCTURE HAVING PROTECTION LAYER FOR PREVENTING LASER DAMAGE

(75) Inventors: Jian-Hong Lin, Huwei (TW);
Kang-Cheng Lin, Yonghe (TW); Tzu-Li Lee, Huwei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/548,039

(22) Filed: Jul. 12, 2012

(65) Prior Publication Data
US 2012/0276732 A1 Nov. 1, 2012

Related U.S. Application Data

(63) Continuation of application No. 11/186,581, filed on Jul. 21, 2005, now Pat. No. 8,242,576.

(51) Int. Cl.
*H01L 21/82* (2006.01)

(52) U.S. Cl.
USPC ..... 438/132; 438/601; 257/529; 257/E23.149

(58) Field of Classification Search
USPC .......... 257/209, 529, 530, 758, 759, E23.146, 257/E23.149, E23.15, E21.592; 438/128, 438/132, 601
See application file for complete search history.

(56) References Cited

U.S. PATENT DOCUMENTS

| | | | | |
|---|---|---|---|---|
| 6,300,232 B1 * | 10/2001 | Satoh | ........................... | 438/601 |
| 6,372,556 B1 * | 4/2002 | Ko | ........................... | 438/132 |
| 6,649,997 B2 * | 11/2003 | Koike | ........................... | 257/529 |
| 6,867,441 B1 * | 3/2005 | Yang et al. | ........................... | 257/209 |
| 6,876,058 B1 * | 4/2005 | Motsiff et al. | ........................... | 257/529 |
| 7,009,222 B2 * | 3/2006 | Yang | ........................... | 257/127 |
| 7,098,491 B2 * | 8/2006 | Hsieh | ........................... | 257/209 |
| 7,459,350 B2 * | 12/2008 | Hsieh | ........................... | 438/132 |
| 2003/0085445 A1 * | 5/2003 | Watanabe | ........................... | 257/529 |
| 2004/0119138 A1 * | 6/2004 | Yang et al. | ........................... | 257/529 |

* cited by examiner

*Primary Examiner* — William F Kraig
(74) *Attorney, Agent, or Firm* — K&L Gates LLP

(57) ABSTRACT

A method for forming a semiconductor structure is provided to prevent energy that is used to blow at least one fuse formed on a metal layer above a semiconductor substrate from causing damage on the structure. The semiconductor structure includes a device, guard ring, protection ring, and at least one protection layer. The device is constructed on the semiconductor substrate underneath the fuse. A seal ring, which surrounds the fuse, is constructed on at least one metal layer between the device and the fuse for confining the energy therein. The protection layer is formed within the seal ring, on at least one metal layer between the device and the fuse for shielding the device from being directly exposed to the energy.

13 Claims, 12 Drawing Sheets

METHOD FOR FORMING SEMICONDUCTOR STRUCTURE HAVING PROTECTION LAYER FOR PREVENTING LASER DAMAGE

This application is a Continuation Application of U.S. application Ser. No. 11/186,581, filed on Jul. 21, 2005, entitled: PROTECTION LAYER FOR PREVENTING LASER DAMAGE ON SEMICONDUCTOR DEVICES, now pending.

BACKGROUND

The present invention relates generally to semiconductor integrated circuit (IC) devices, and more particularly to a method for forming protection layers for preventing damage on semiconductor IC devices during a fuse blowing process.

The steady down-scaling of complementary metal-dielectric-semiconductor (CMOS) device dimensions has been the main stimulus to the growth of microelectronics and the computer industry over the past two decades. The more an IC is scaled, the higher becomes its packing density. Today, after many generations of scaling, the smallest feature in a CMOS transistor is approaching nano-scale dimensions. As a result of the increased packing density, the complexity of ICs has dramatically increased. This increase in IC complexity leads to a corresponding increase in design and fabrication errors during the development and manufacture of ICs. It is desired to modify a portion of the functionality of an IC without starting a new costly IC development effort.

Fuses are routinely used in the design of ICs, and in particular in memory devices as elements for altering the circuit configuration for those memory devices. As such, memories are commonly built with programmed capabilities wherein fuses are selectively "blown" (melted away) by, as an example, a laser beam. Fuse elements are typically made of materials, such as aluminum, copper, polysilicon, silicide, and other conductive metal or alloy.

It is well known that random access memories (RAM) are designed with redundancies which include spare columns or rows of electric elements. When any of the elements fails, the defective rows and columns are replaced by the corresponding spare elements. Fuses, which are strategically placed throughout the IC, accomplish disabling and enabling of these spare elements.

The use of a laser beam to "blow" the fuses to modify the circuit configuration of an IC can induce certain failure mechanisms. Fuses are usually fabricated on the top metal layer of an IC for easy laser access. A laser beam is directed onto the desired fuse to melt the copper (or other materials) until an open occurs to obtain a desired circuit modification. However, only a small percentage (~30%) of the laser energy is actually directed onto the fuse. Significant laser energy (~70%) penetrates subsequent lower layers (typically comprised of dielectric insulating layers) down to the semiconductor substrate. As a result, significant damage can easily occur in areas other than those occupied by the fuses.

One failure mechanism that occurs due to the laser blow process is the damage to the substrate below the fuse due to the excess laser energy. In conventional designs, no electronic devices or circuits are placed beneath the fuse due to potential damage during the laser blow process. This results in unused areas of the substrate, which decreases packaging densities. A conventional method to eliminate this failure mode is to incorporate a reflective protective surface structure on the layer beneath the fuse. This reflective structure protects subsequent layers and the substrate from laser damage. However, this reflective structure is not an ideal solution to protect the IC from laser induced cracks, low K dielectric thermal shrinkage, or laser beam burn out.

Another failure mechanism that occurs during the process of blowing a fuse with a laser is that the gate dielectric layer of a device close to the fuse can be irreparably damaged by laser energy. One conventional method to reduce this gate dielectric layer damage is to utilize thick gate dielectric layers. However, this is not a practical solution for submicron geometry ICs due to size and performance limitations. Another conventional method to alleviate this condition is to add a protection diode either in series or parallel with the fuse. The protection diode dissipates excess energy before it is applied to the gate dielectric layer of a device close to the fuse.

Therefore, desirable in the art of laser fuse blowing are alternative designs that increase the effective layout area utility rate while avoiding failures induced by the fuse blowing process.

SUMMARY

The present invention provides a method for forming a semiconductor structure for preventing energy that is used to blow at least one fuse formed on a metal layer above a semiconductor substrate from causing damage. In one embodiment, the method includes the step of forming a fuse block containing a set of fuses and a protection diode constructed on the semiconductor substrate and disposed directly beneath the fuse block. The method further includes the step of forming a guard ring surrounding the set of fuses and a protection ring structure vertically constructed within the guard ring, on one or more metal layers between the fuse and the device for enhancing a structural strength thereof. In addition, the method includes the step of forming a protection layer disposed directly beneath the fuse block, the protection layer being comprised of a first metal layer having a dimension wider and longer than that of the fuse block to protect the protection diode and the semiconductor substrate disposed directly beneath the fuse block from being exposed to the energy, wherein the protection layer is electrically isolated from the set of fuses by at least one dielectric layer and is substantially in parallel with the semiconductor substrate.

The construction of the invention, however, together with additional objects and advantages thereof will be best understood from the following description of specific embodiments when read in connection with the accompanying drawings.

DESCRIPTION

Figure 1A:
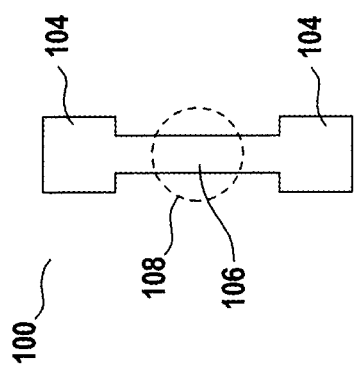
FIG. 1A presents a top-view of a conventional fuse.

FIG. 1A presents a conventional fuse 100. The fuse 100 includes two conductive pads 104 attached to a fuse link 106. A laser pointing position is shown by a laser spot 108, within which the energy transmitted by the laser is dispersed. The fuse link 106 absorbs only a fraction of the total transmitted laser energy. As a result, the total transmitted laser energy must significantly exceed the energy required to blow the fuse 100. This excess laser energy can cause serious damage to IC structures such as the substrate and dielectric layers, etc.

Figure 1C:
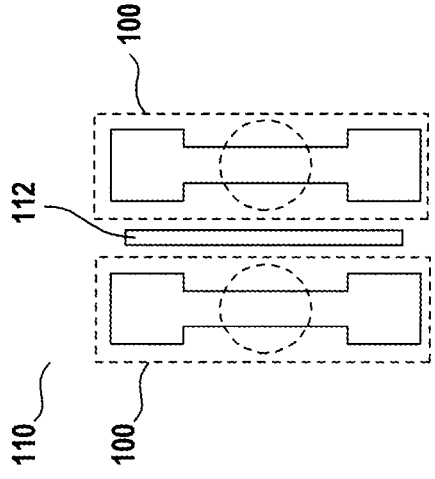
FIGS. 1B and 1C present conventional fuse bank structures.
Figure 1B:
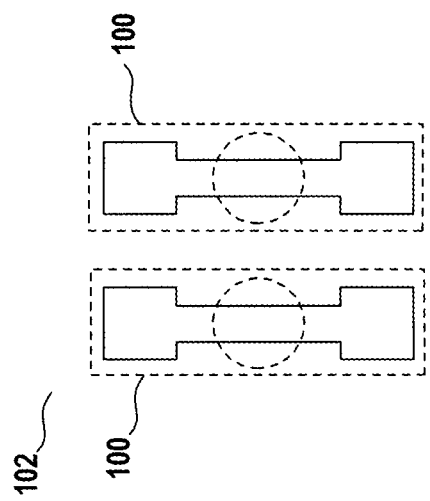

FIGS. 1B and 1C present two conventional fuse bank structures 102 and 110. The fuse bank structures 102 and 110 include multiple fuses 100 arranged in a parallel fashion to allow for easy access by laser equipment. A dummy fuse 112 can be inserted between two adjacent fuses in the fuse bank structure 110 to achieve better planarization. The dummy fuse 112 is typically placed at the center of the open spaces between two fuses. The dummy fuse 112 is a section of interconnection line within the fuse bank structure 110, electrically isolated from other fuses 100 in the fuse bank 110.

A conventional fuse 100 typically covers less than one-third of the laser spot 108 area. Nearly 70% of the laser energy is transmitted into other areas of the IC not covered by the fuse 100. As a result, substantial damage to the substrate and IC components can occur in the areas not covered by the fuse due to the high rate of absorption and high-transmitted laser energy. Conventional protection layer structures can reduce but not eliminate the potential substrate damage.

Figure 1D:
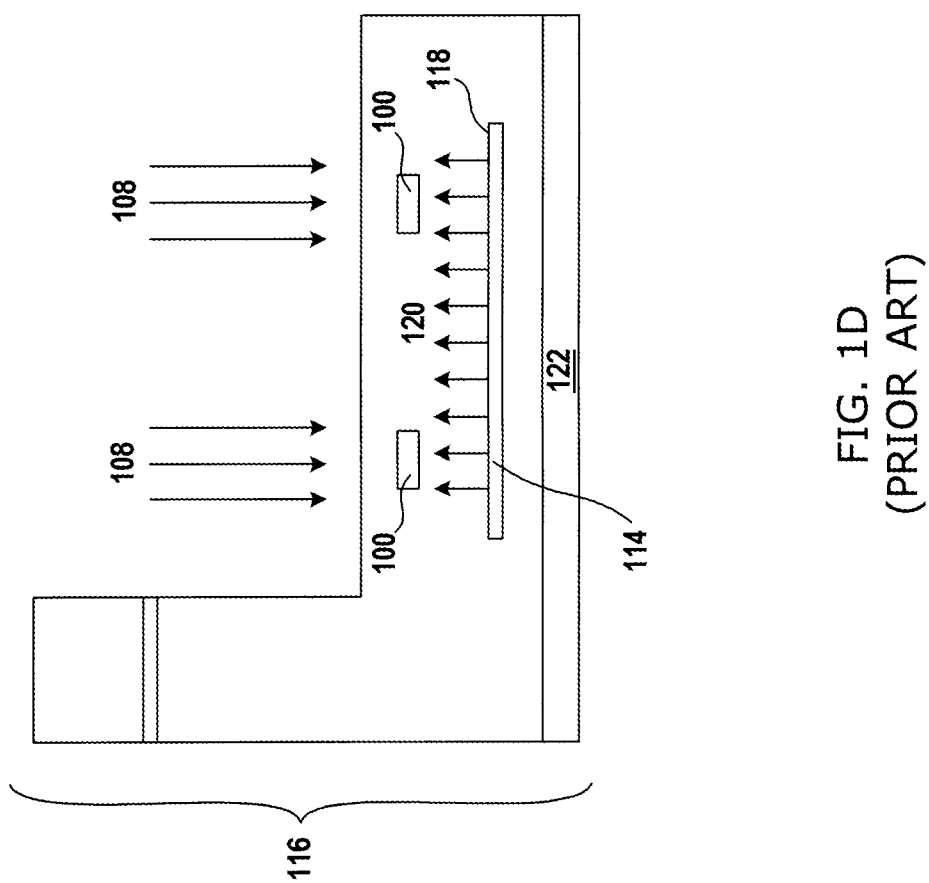
FIG. 1D presents a cross-sectional view of a conventional protection layer structure.

FIG. 1D presents a conventional protection layer structure 114 used in a typical IC structure 116. The protection layer structure 114 is a reflective structure positioned beneath the fuses 100. The protection layer structure 114 typically includes conductive materials, such as aluminum and other reflective materials. A reflective surface 118 is used to focus any reflected laser beam energy 120. The laser energy is directed to the laser spot 108 over the desired fuse 100. The excess laser energy that would normally be directed onto substrate 122 is instead reflected back to the bottom of the fuse 100, which directs additional energy onto the fuse to more efficiently blow the fuse.

This protection layer structure 114 helps to protect layers underlying the fuses 100 and the substrate 122 from laser damage. However, this protection layer structure 114 is not an ideal structure to protect the IC from laser-induced cracks, low-K dielectric thermal shrinkage, or laser beam burn out. A more robust protection layer is required to eliminate these failure modes.

Figure 2A:
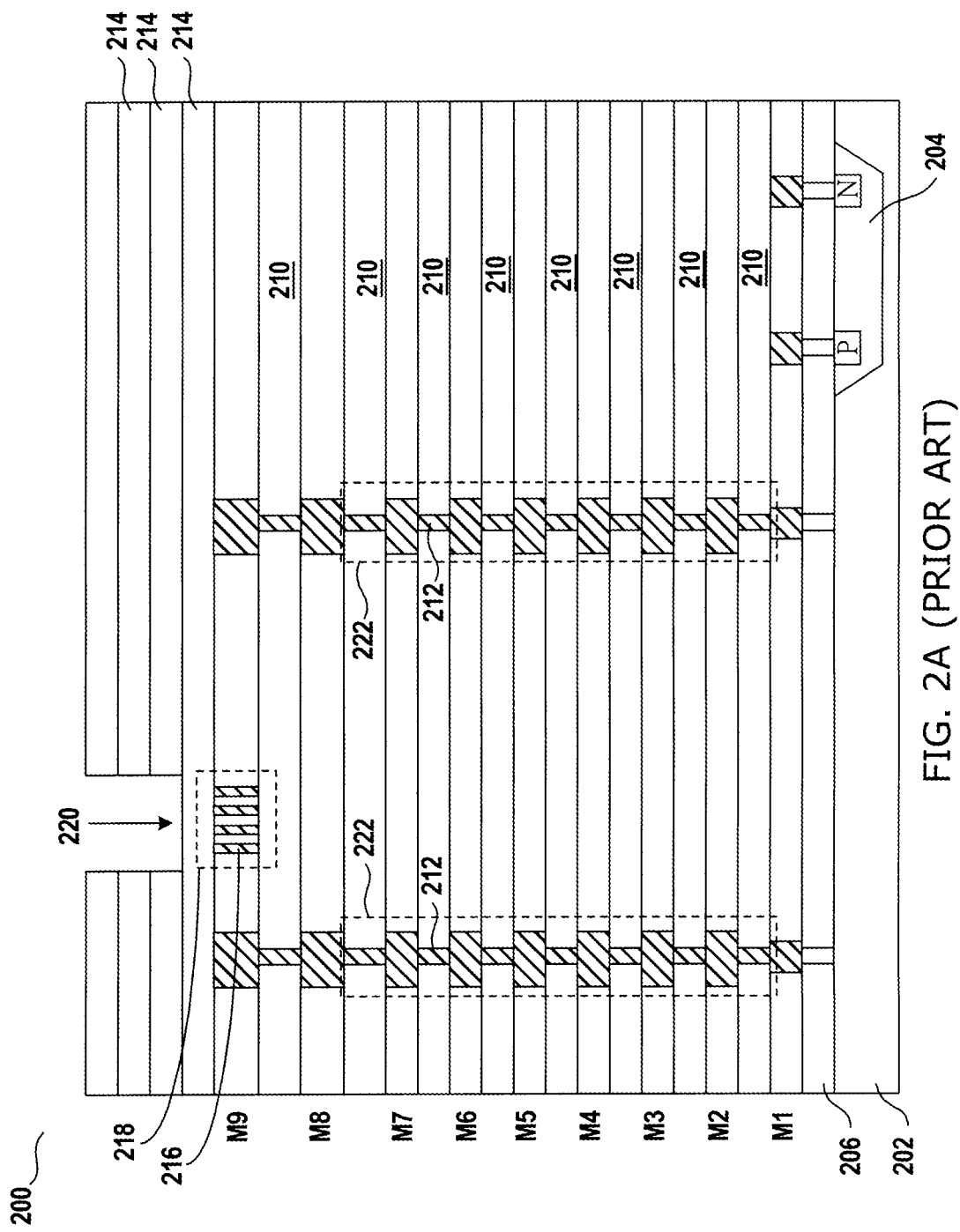
FIG. 2A presents a cross-sectional view of a conventional multiple metal interconnect layer IC structure.

FIG. 2A presents a cross-sectional view of a conventional multiple metal interconnect layer IC structure 200. The IC structure 200 includes a silicon substrate 202 on which a protection diode 204 and the rest of the IC circuitry (not shown) are deposited.

A dielectric layer 206 provides electrical isolation between the substrate 202 and a M1 metal layer. In this example, there are 9 metal layers (M1 through M9) with a dielectric layer 210 between two metal layers. The metal layers are interconnected by conductive vias 212. Multiple insulating layers 214 are utilized in this IC design for isolation. Multiple fuses 216 are typically located together on the top metal layer (layer M9) in a fuse block 218. The fuse block 218 is located on the top metal layer for easy access by laser equipment using laser energy 220 to blow a desired fuse for modification of the IC circuitry.

The conductive vias 212 in conjunction with the metal layers form a seal ring 222 around the fuse block 218 to protect the IC circuitry outside the fuse block 218 from laser damage. The seal ring 222, constructed by multiple metal layers and conductive vias 212 around the fuse block 218, inhibits any vertical laser induced dielectric cracks and excessive thermal energy from spreading. Note that in this IC structure 200, neither device, circuit, protection diodes, nor other circuits may be constructed beneath the fuse block 218 due to potential damage during the laser blow process. Therefore, the protection diode 204 is located in substrate areas other than that under the fuse block 218, the effect of which is the consumption of additional layout area. This unused area beneath the fuse block 218 results in a less-than-optimum use of the layout space. As well, the part of the substrate 202 under the fuse block 218 in the IC structure 200 is very susceptible to laser damage.

Figures 2B, 2C:
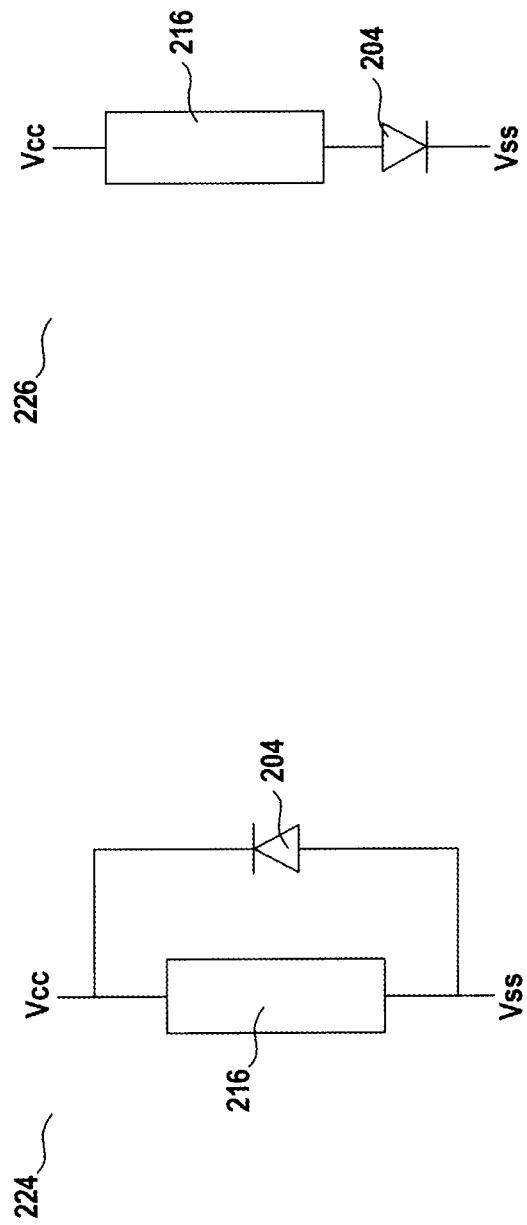
FIGS. 2B and 2C present conventional fuse protection circuits.

FIGS. 2B and 2C present two conventional fuse circuits 224 and 226 that include fuses 216 and protection diodes 204. The diode 204 connected to the fuse 216 can be NP/PW or PP/NW diodes with large capacitance values and thick dielectric layers. In the IC structure 200 as shown in FIG. 2A, if the diode 204 is an NP/PW diode its area should be greater than 0.5 um$^2$, while if the diode 204 is a PP/NW diode its area should be greater than 1 um$^2$. In the circuit 224, the fuse 216 is in parallel with an NP/PW diode 204, which dissipates excess laser energy therethrough. In the alternative protection circuit 226, the fuse 216 is in series with a PP/NW diode 204, which also dissipates excess laser energy during the laser blow process.

Figure 3A:
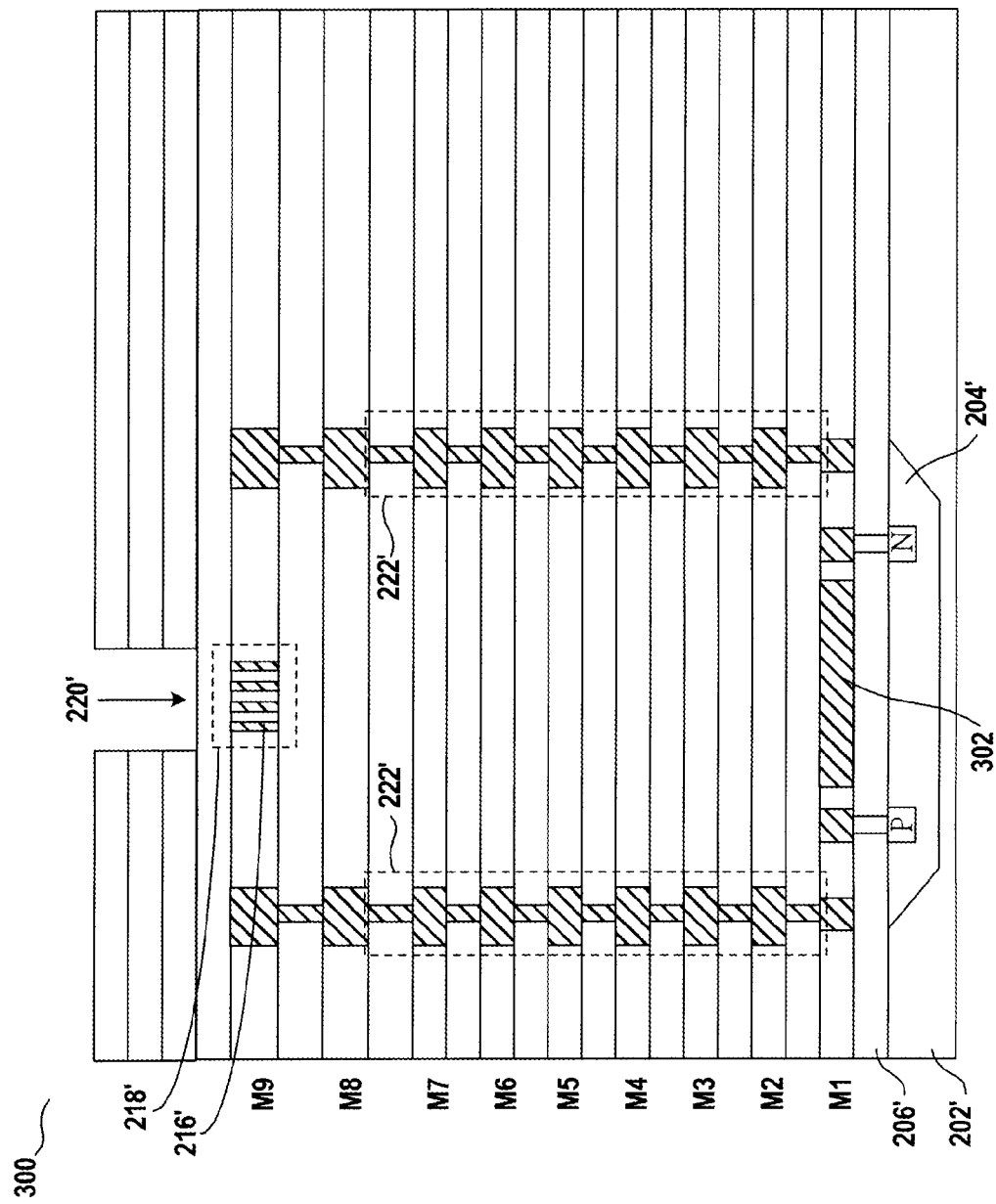
FIG. 3A presents a cross-sectional view of a protection layer structure in accordance with one embodiment of the present invention.

FIG. 3A presents a cross-sectional view of a M1 protection layer structure 300 in accordance with one embodiment of the present invention. The M1 protection layer structure 300 includes a M1 protection layer 302 and a protection diode 204' with a larger thermal reservoir. In this embodiment, while the M1 protection layer 302 is substantially made of copper, it can also be made of a material, such as aluminum or aluminum alloys. The M1 protection layer 302 is continuously constructed as a part of the M1 metal layer, such that it provides a protective shield over the dielectric layer 206' and the substrate 202' directly beneath the fuse block 218' from the laser energy 220'. The M1 protection layer 302 protects the IC from laser induced cracks, low-K dielectric thermal shrinkage, or laser beam burn out. In addition, at least one protection diode 204' can be located directly beneath the fuse block 218'. Other circuits, as well, may be implemented in this area. This effectively increases the layout space utility rate.

The protection diode 204' in this embodiment has a larger thermal reservoir compared to those of the conventional protection diodes, because it is designed with a larger surface area (minimum 1-2 um$^2$ per diode). This larger thermal reservoir allows for better thermal dissipation during laser illumination, and by extension increased protection of the protection diode 204' and its associated circuitry.

The laser energy 220' is directed onto the desired fuse 216' in the fuse block 218' to blow the fuse. The energy not impeded by the fuse travels into the lower IC layers until contacting the M1 protection layer 302 and is partially absorbed and dissipated by thermal heating and partially reflected back to the fuse 216'. A part of the substrate 202' beneath the M1 protection layer 302 is not damaged and is therefore safe for construction of devices or circuitry. This M1 protection layer structure 300 also incorporates the conventional stacked via seal ring 222' to protect the IC circuitry outside the fuse block 218' area from laser damage. This embodiment utilizes the M1 protection layer 302 to provide robust protection to the substrate 202'. It uses the protection diode 204' to protect the gate dielectric layers of transistors connected to the fuses 216', and also uses the seal ring 222' to protect the IC circuitry outside the fuse block 218' area.

Figure 3B:
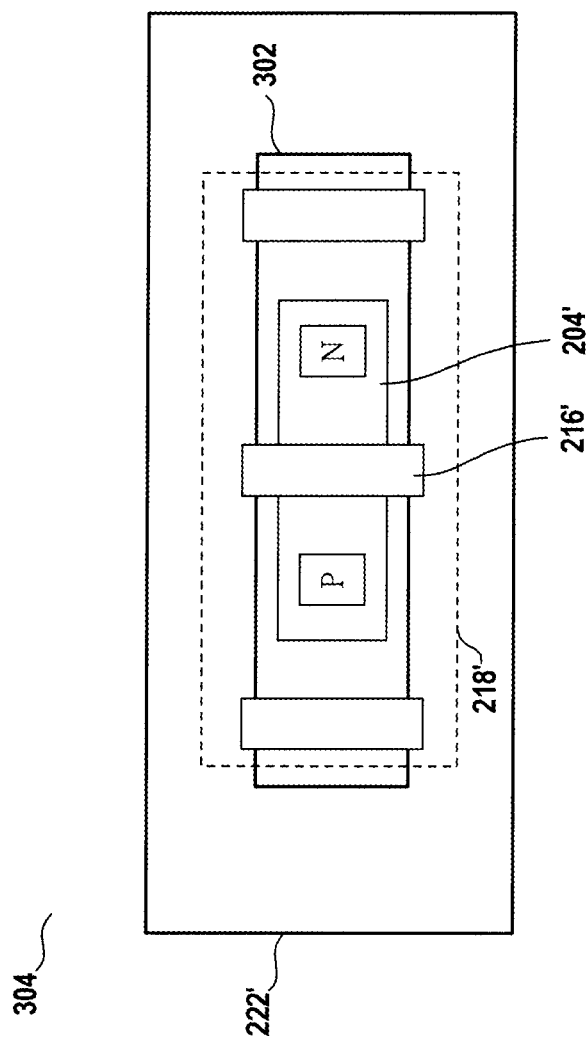
FIG. 3B presents a top view of the protection layer structure in accordance with the embodiment of the present invention.

FIG. 3B presents a top view 304 of the M1 protection layer structure in accordance with the embodiment of the present invention. The M1 protection layer 302 is located below the individual fuses 216' in the fuse block 218'. The protection diode 204' is shown below the M1 protection layer 302. As explained previously, the seal ring 222' protects IC areas outside the fuse block from laser damage.

Figure 4A:
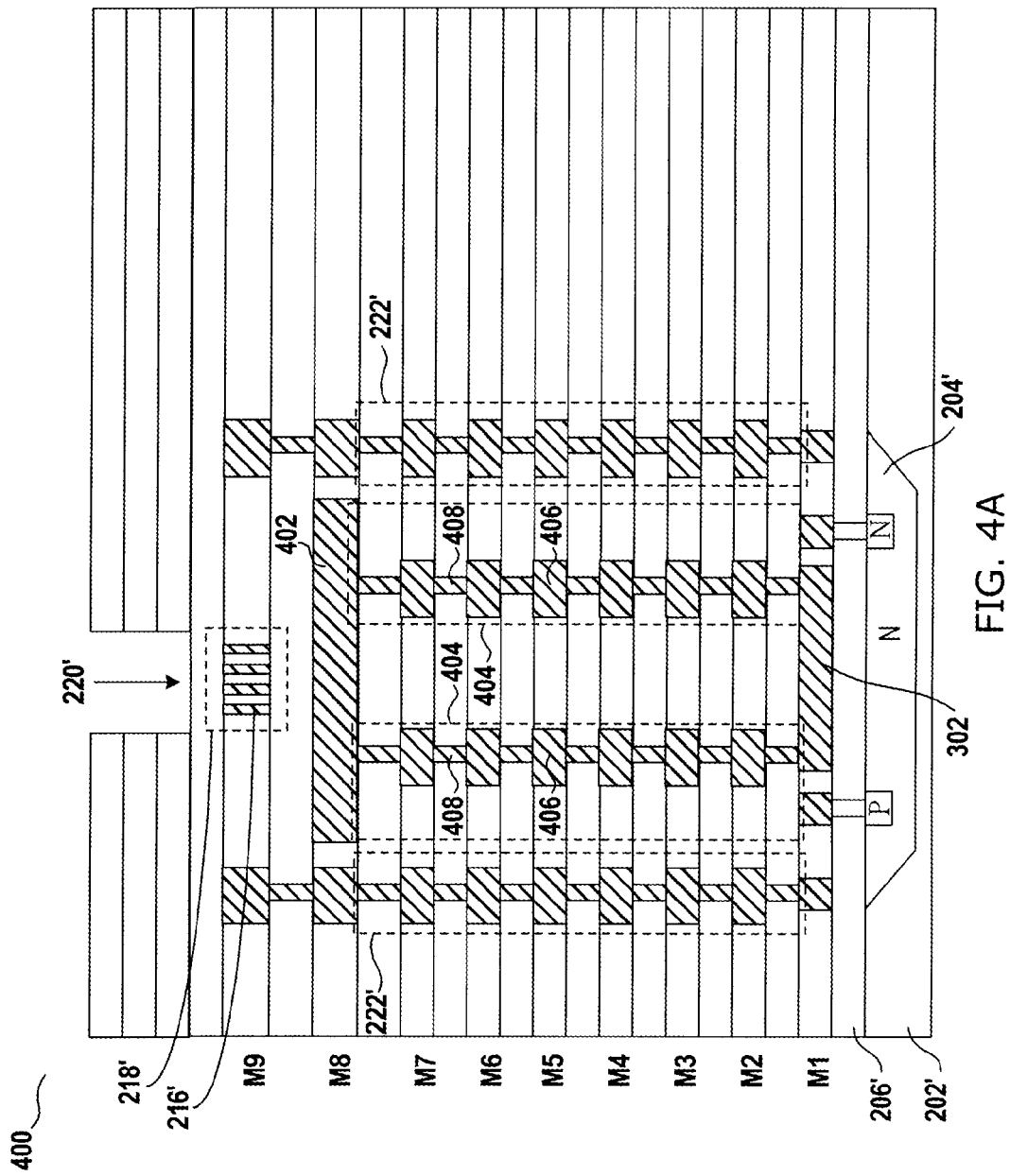
FIG. 4A presents a cross-sectional view of a horizontal protection layer structure in accordance with another embodiment of the present invention.

FIG. 4A presents a cross-sectional view of an Mx horizontal protection layer structure 400 in accordance with another embodiment of the present invention. The structure 400 incorporates a protection layer 402, an Mx protection ring structure 404, and the protection diode 204' with a larger thermal reservoir compared to that of a conventional protection diode. The Mx protection ring structure 404 includes multiple rings 406 interconnected between metal layers by vias 408. In this embodiment, the protection layer 402 is constructed as part of any one of metal layers M2 through M8, such that it provides a protective shield over the areas of the dielectric layer 206' and the substrate 202' that are directly beneath the fuse block 218' from being exposed to the laser energy 220'. As shown in FIG. 4A, the protection layer 402 is located in M8. This protection layer 402 reflects a majority of the excess laser energy back to the fuse 216'. The M1 protection layer 302 and the seal ring 222' may be optionally included for enhanced protection or left out for reducing material costs. This protection layer 402 and the Mx protection ring structure 404 protect the IC from laser induced cracks, low-K dielectric thermal shrinkage, or laser beam burn out. The structure 400 also provides the space saving efficiency similar to that provided by the structure 300 as discussed earlier.

Figure 4B:
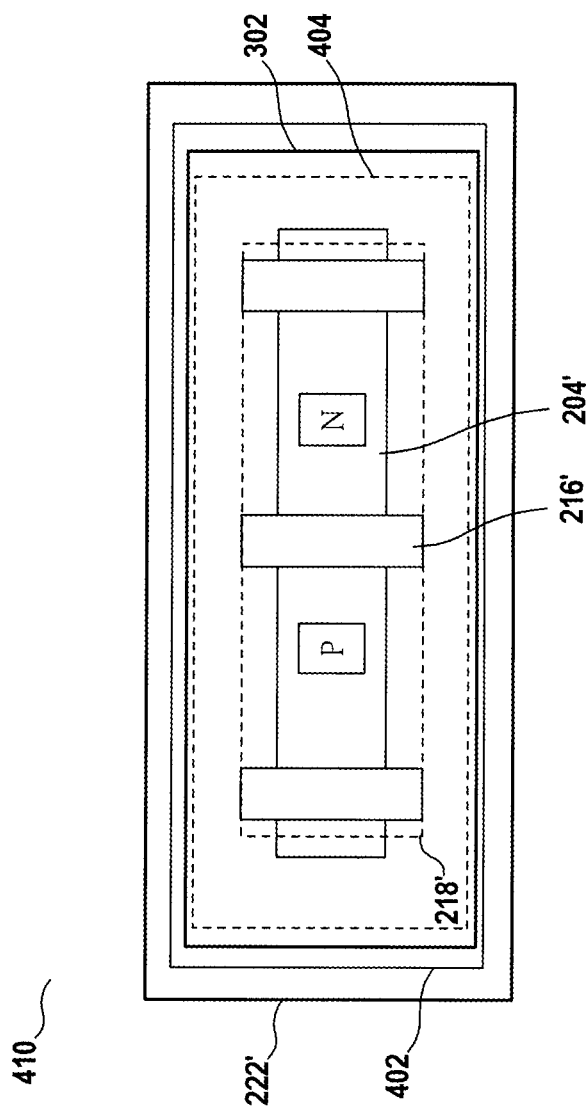
FIG. 4B presents a top view of the horizontal protection layer structure in accordance with the embodiment of the present invention.

FIG. 4B presents a top view 410 of the Mx protection layer structure in accordance with another embodiment of the present invention. As shown, the protection mechanism includes the protection layer 402, the Mx protection ring structure 404, an optional M1 protection layer 302, and an optional seal ring 222'. The protection diode 204' is shown beneath the fuses 216' in the fuse block 218'. The protection diode 204' is protected from the laser by the protection layer 402 and the Mx protection ring structure 404. The M1 protection layer 302 optionally provides further protection for the protection diode 204', while the seal ring 222' optionally protects the IC area not directly under the fuse block 218' from the laser energy.

Figure 5A:
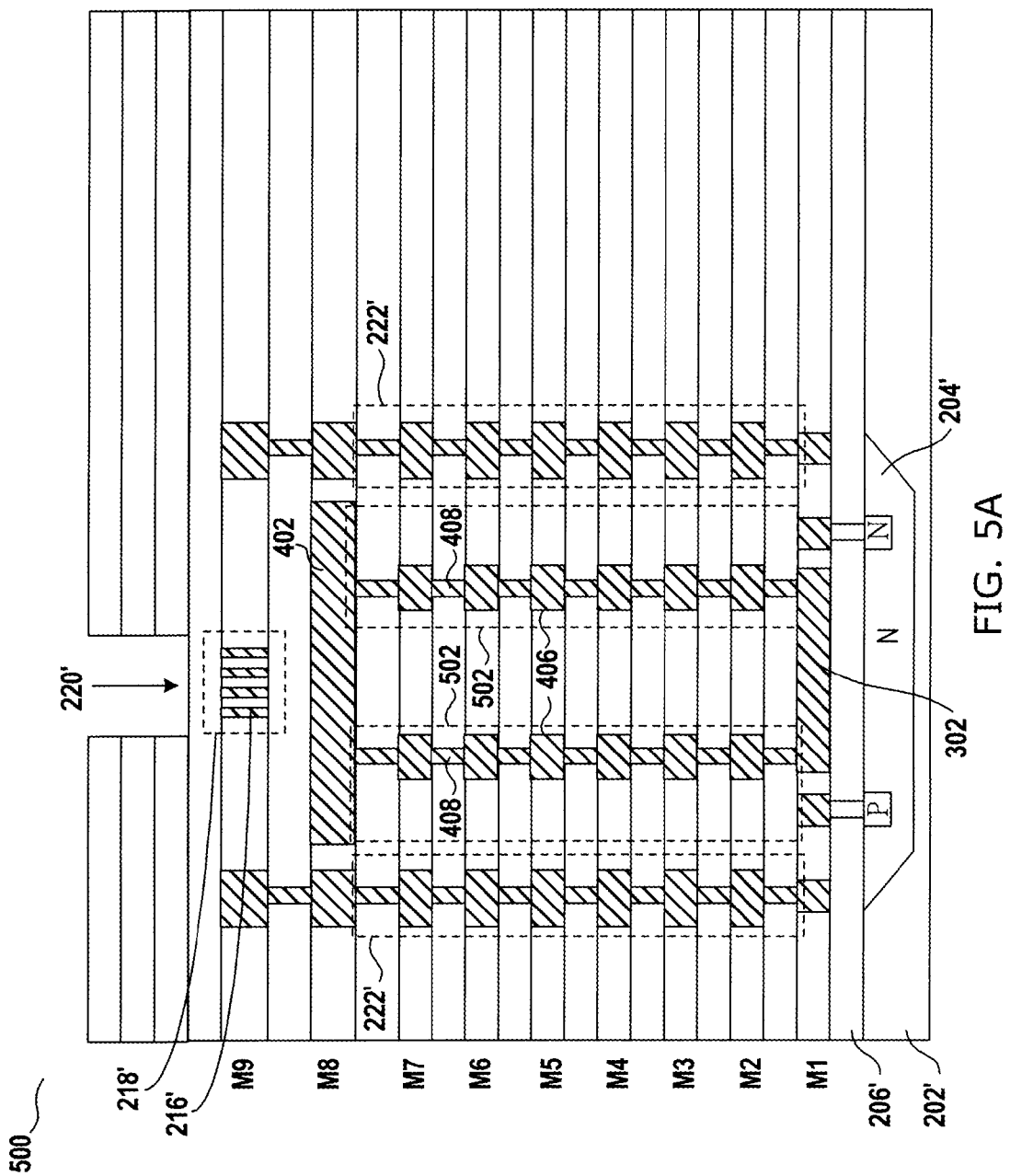
FIG. 5A presents a cross-sectional view of a vertical protection layer structure in accordance with another embodiment of the present invention.

FIG. 5A presents a cross-sectional view of a My vertical protection layer structure 500 in accordance with another embodiment of the present invention. The structure 500 incorporates the protection layer 402 and a My protection structure 502. The My protection structure 502 includes multiple rings 406 interconnected between metal layers by vias 408. In this embodiment, the protection layer 402 is constructed as part of any one of metal layers M2 through M8 such that it provides a protective shield over the areas of the dielectric layer 206' and the substrate 202' that are directly beneath the fuse block 218' from the laser energy 220'. The protection layer 402 reflects a majority of the excess laser energy back to the fuse 216'. The M1 protection layer 302 and the seal ring 222' are optionally incorporated for enhanced protection. The protection layer structure 402 and the My protection structure 502 protect the IC from laser induced cracks, low-K dielectric thermal shrinkage, or laser beam burn out. The structure 500 provides the space saving efficiency similar to that provided by the structure 300 as discussed earlier. Similar to previous embodiments, this embodiment also includes the protection diode 204' with a larger thermal reservoir to provide increased protection to the gate dielectric layers of devices connected to the fuses.

Figure 5B:
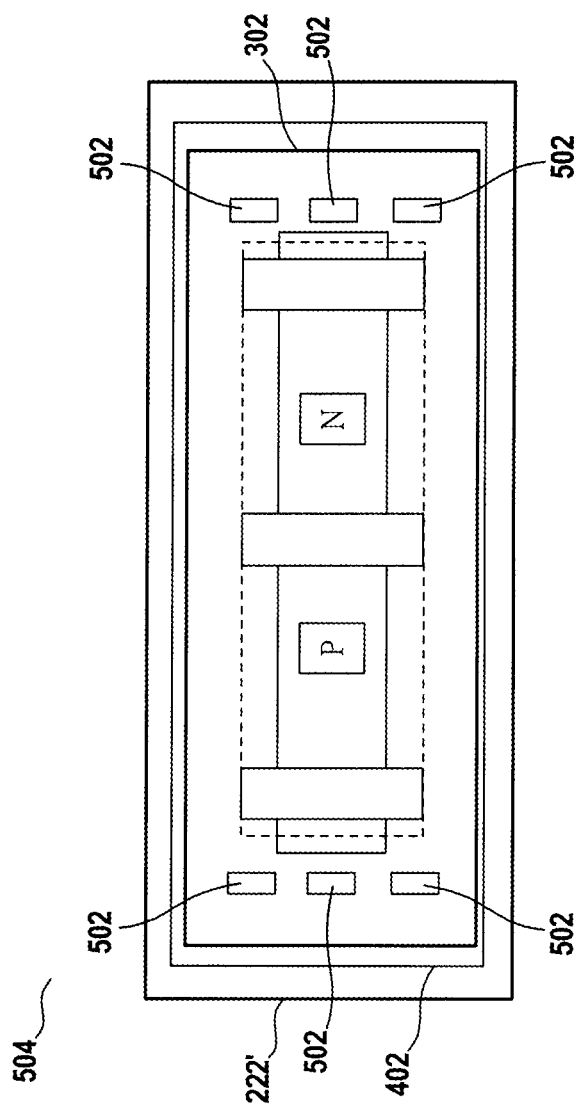
FIG. 5B presents a top view of the vertical protection layer structure in accordance with the embodiment of the present invention.

FIG. 5B presents a top view 504 of the My protection layer structure in accordance with the embodiment of the present invention. As shown, the protection structure includes the protection layer 402, the My protection structure 502, the optional M1 protection layer 302 and the optional seal ring 222'. It is noted that while the My protection structure 502 has a similar cross-sectional view as that of the protection ring structure 404 in FIG. 4A, their layout views are different.

Figure 6A:
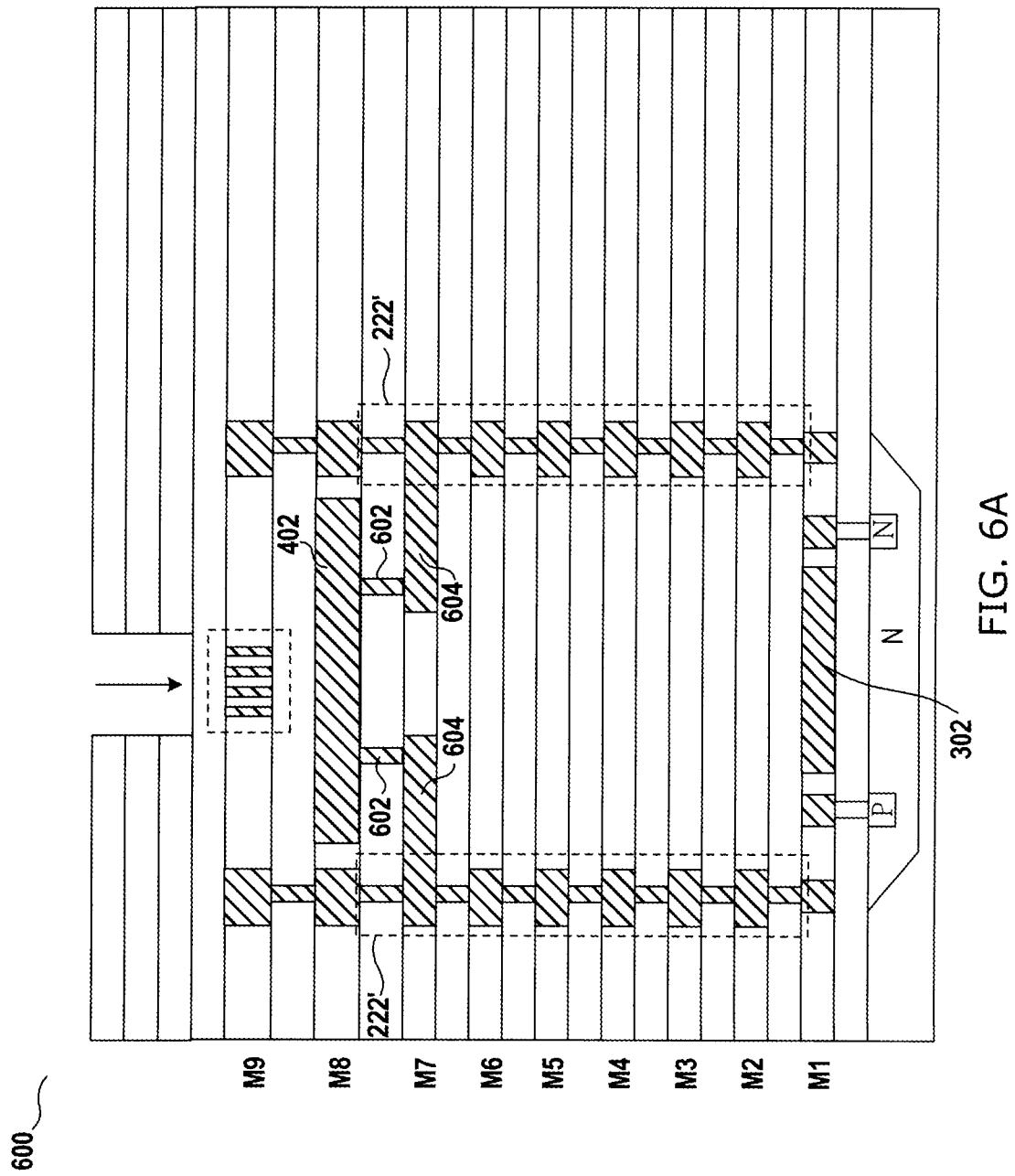
FIG. 6A presents a protection layer structure with a partial protection layer in accordance with another embodiment of the present invention.

FIG. 6A presents a protection layer structure 600 with a discontinuous protection layer 604 in accordance with another embodiment of the present invention. The structure 600 incorporates the discontinuous protection layer 604 which is electrically and mechanically connected to the protection layer 402 through vias 602. The combination of the protection layer 402 and the discontinuous protection layer 604 provides an ability to use multiple metal layers for constructing a full protection layer. The seal ring 222' optionally provides further laser protection by eliminating any laser paths through the IC layers to the substrate area below the fuses. Note that the M1 protection layer 302 is incorporated optionally in this example for enhanced protection.

Figure 6B:
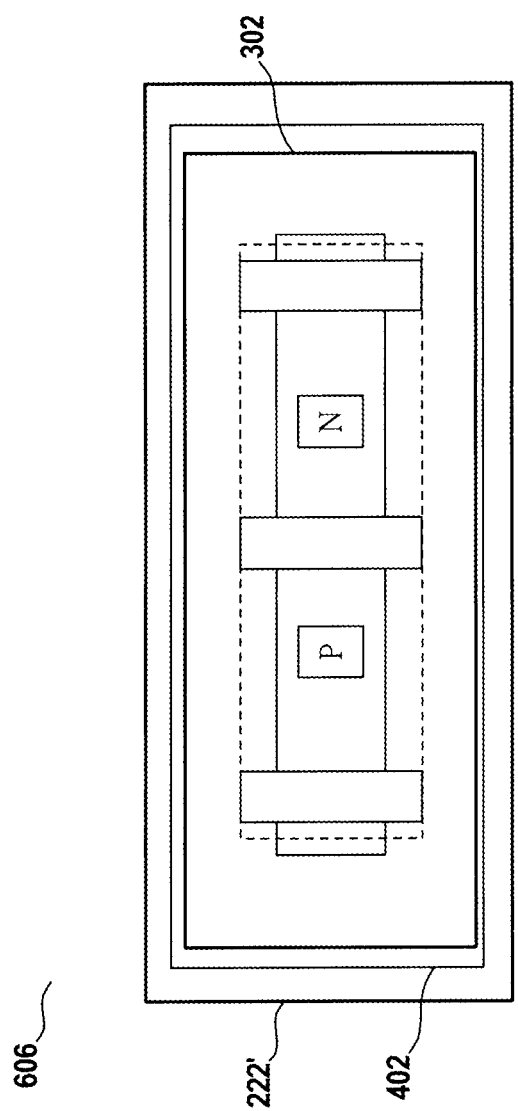
FIG. 6B presents a top view of the protection layer structure in accordance with the embodiment of the present invention.

FIG. 6B presents a top view 606 of the protection layer structure in accordance with the embodiment of the present invention. In this embodiment, the protection structures include the protection layer 402, the optional seal ring 222', and the optional M1 protection layer 302.

It is noted that a combination of the above embodiments on a plurality of metal layers may be implemented to provide a custom and robust IC protection scheme based on various design rules and limits. For example, the above mentioned protection mechanism may have one or more optional features removed or added based on a specific protection requirement.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming a semiconductor structure for preventing energy that is used to blow at least one fuse formed on a metal layer above a semiconductor substrate from causing damage, the method comprising:
   forming a fuse block containing a set of fuses;
   forming a protection diode constructed on the semiconductor substrate and disposed directly beneath the fuse block, wherein the protection diode is electrically coupled to the set of fuses for dissipating the energy;
   forming a guard ring surrounding the set of fuses, the guard ring being constructed on at least one metal layer between the protection diode and the set of fuses for confining the energy therein;
   forming a protection ring structure vertically constructed within the guard ring, on one or more metal layers between the fuse and the device for enhancing a structural strength thereof, and
   forming a protection layer disposed directly beneath the fuse block, the protection layer being comprised of a first metal layer having a dimension wider and longer than that of the fuse block to protect the protection diode and the semiconductor substrate disposed directly beneath the fuse block from being exposed to the energy, wherein the protection layer is electrically isolated from the set of fuses by at least one dielectric layer and is substantially in parallel with the semiconductor substrate.

2. The method as recited in claim 1, wherein the energy is in a form of a laser beam having a cross-sectional diameter larger than a width of the fuse.

3. The method as recited in claim 1, wherein the protection layer is continuously constructed on one metal layer.

4. The method as recited in claim 1, wherein the protection layer is discontinuously constructed on one metal layer.

5. The method as recited in claim 1, wherein the protection ring structure comprises one or more rings connected by one or more vias in one or more metal layers.

6. The method as recited in claim 1, wherein the protection layer is substantially made of copper.

7. The method as recited in claim 1, wherein the protection diode is a PN junction diode.

8. A method for forming a semiconductor structure for preventing a laser beam that is used to blow at least one fuse formed on a metal layer above a semiconductor substrate from causing damage, the method comprising:
   forming a fuse block containing a set of fuses;
   forming a protection diode constructed on the semiconductor substrate and disposed directly beneath the fuse block, wherein the protection diode is electrically coupled to the set of fuses for dissipating the energy;
   forming a guard ring surrounding the set of fuses, the guard ring being constructed on at least one metal layer between the protection diode and the set of fuses for confining the energy therein;
   forming a first protection layer disposed directly beneath the fuse block, the first protection layer being comprised of a first metal layer having a dimension wider and longer than that of the fuse block to protect the protection diode and the semiconductor substrate disposed directly beneath the fuse block from being exposed to the energy, wherein the first protection layer is electrically isolated from the set of fuses by at least one dielectric layer;
   forming a protection ring structure vertically constructed within the guard ring, on one or more metal layers between the fuse and the device for enhancing a structural strength thereof; and
   forming a second protection layer disposed directly beneath the fuse block and above the first protection layer, the second protection layer being comprised of a second metal layer having a dimension wider and longer than that of the first protection layer to protect the underlying semiconductor substrate and the protection diode from being exposed to the energy, wherein the second protection layer is electrically isolated from the set of fuses by at least one dielectric layer.

9. The method as recited in claim 8, wherein the first protection layer is continuously constructed on one metal layer.

10. The method as recited in claim 8, wherein the second protection layer is discontinuously constructed on another metal layer.

11. The method as recited in claim 8, wherein the protection ring structure comprises one or more rings connected by one or more vias in one or more metal layers.

12. The method as recited in claim 8, wherein the first protection layer is substantially made of copper.

13. The method as recited in claim 8, wherein the protection diode is a PN junction diode.

* * * * *